(12) United States Patent
Rogers et al.

(10) Patent No.: US 8,994,089 B2
(45) Date of Patent: Mar. 31, 2015

(54) INTERLAYER POLYSILICON DIELECTRIC CAP AND METHOD OF FORMING THEREOF

(75) Inventors: Matthew S. Rogers, Mountain View, CA (US); Klaus Schuegraf, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 320 days.

(21) Appl. No.: 13/294,608

(22) Filed: Nov. 11, 2011

(65) Prior Publication Data

US 2013/0119451 A1  May 16, 2013

(51) Int. Cl.
*H01L 29/788* (2006.01)
*H01L 21/28* (2006.01)
*H01L 27/115* (2006.01)
*H01L 21/67* (2006.01)

(52) U.S. Cl.
CPC .... *H01L 21/28273* (2013.01); *H01L 27/11521* (2013.01); *H01L 21/67167* (2013.01)
USPC ...................................... 257/315; 257/E29.3

(58) Field of Classification Search
CPC ................... H01l 27/11521; H01I 29/42324; H01L 29/7883
USPC ............... 257/315, 316, 321, E29.3, E29.304
See application file for complete search history.

(56) References Cited

U.S. PATENT DOCUMENTS

| | | | | |
|---|---|---|---|---|
| 7,612,404 B2 * | 11/2009 | Yamamoto et al. | ........... | 257/321 |
| 7,679,127 B2 | 3/2010 | Shiozawa et al. | | |
| 8,383,481 B2 * | 2/2013 | Tanaka | ........................ | 438/264 |
| 8,466,022 B2 * | 6/2013 | Tanaka | ........................ | 438/264 |
| 8,471,319 B2 * | 6/2013 | Matsuo et al. | ................. | 257/296 |
| 8,546,216 B2 * | 10/2013 | Iikawa et al. | ................. | 438/257 |
| 2007/0241388 A1 * | 10/2007 | Yamamoto et al. | ........... | 257/314 |
| 2007/0262372 A1 * | 11/2007 | Yamamoto et al. | ........... | 257/324 |
| 2008/0121972 A1 * | 5/2008 | Shiozawa et al. | ............. | 257/316 |
| 2009/0011586 A1 * | 1/2009 | Akahori et al. | ................ | 438/591 |
| 2010/0093142 A1 * | 4/2010 | Ho et al. | ........................ | 438/261 |
| 2010/0102377 A1 * | 4/2010 | Iikawa et al. | ................. | 257/324 |
| 2010/0248435 A1 | 9/2010 | Olsen et al. | | |
| 2011/0217834 A1 * | 9/2011 | Ganguly et al. | ............. | 438/593 |
| 2011/0256708 A1 | 10/2011 | Choi et al. | | |
| 2012/0068246 A1 * | 3/2012 | Tanaka | .......................... | 257/316 |

OTHER PUBLICATIONS

International Search Report and Written Opinion mailed Mar. 27, 2013 for PCT Application No. PCT/US2012/063841.

(Continued)

*Primary Examiner* — William F Kraig
*Assistant Examiner* — Latanya N Crawford
(74) *Attorney, Agent, or Firm* — Moser Taboada; Alan Taboada (57) ABSTRACT

In some embodiments, an interlayer polysilicon dielectric cap disposed atop a substrate having a first floating gate, a second floating gate and an isolation layer disposed between the first floating gate and the second floating gate may include: a first nitrogen containing layer disposed atop an upper portion and sidewalls of the first floating gate and second floating gate; a first oxygen containing layer disposed atop the first nitrogen containing layer and an upper surface of the isolation layer; a second nitrogen containing layer disposed atop an upper portion and sidewalls of the first oxygen containing layer; and a second oxygen containing layer disposed atop the second nitrogen containing layer and an upper surface of the first oxygen containing layer.

15 Claims, 7 Drawing Sheets

(56) References Cited

OTHER PUBLICATIONS

C. H. Liu, et al., "A Novel Multi-Nitridation ONO Interpoly Dielectric (MN-ONO) for Highly Reliable and High Performance NAND Flash Memory", *International Symposium on VLSI Technology, Systems, and Applications*, Apr. 27-29, 2009, pp. 35-36.

Kwang Soo Seol, et al., "A New Floating Gate Cell Structure With a Silicon-Nitride Cap Layer for Sub-20 nm NAND Flash Memory", *2010 Symposium on VLSI Technology Digest of Technical Papers*, Jun. 15-17, 2010, pp. 127-128.

\* cited by examiner

INTERLAYER POLYSILICON DIELECTRIC CAP AND METHOD OF FORMING THEREOF

FIELD

Embodiments of the present invention generally relate to semiconductors and processes of forming semiconductors.

BACKGROUND

The inventors have observed that scaling semiconductor devices by simply shrinking the device structure often does not produce acceptable results at small dimensions. In NAND flash memory devices, when a feature, such as a tunnel oxide layer, an inter polysilicon dielectric (IPD) cap, or the like is scaled, undesired leakage can occur between, for example, a substrate and a floating gate, a floating gate and a control gate, or the like. For example, the inventors have observed that when scaling flash memory devices, conformal nitride layers used to form conventional inter polysilicon dielectric caps may electrically couple adjacent floating gates, thereby causing leakage between adjacent floating gates, thus decreasing device performance.

Accordingly, the inventors have provided improved semiconductor devices using an interlayer polysilicon dielectric cap and methods of making thereof.

SUMMARY

An interlayer polysilicon dielectric cap and method of forming thereof is provided herein. In some embodiments, an interlayer polysilicon dielectric cap disposed atop a substrate having a first floating gate, a second floating gate and an isolation layer disposed between the first floating gate and the second floating gate may include a first nitrogen containing layer disposed atop an upper portion and sidewalls of the first floating gate and second floating gate; a first oxygen containing layer disposed atop the first nitrogen containing layer and an upper surface of the isolation layer; a second nitrogen containing layer disposed atop an upper portion and sidewalls of the first oxygen containing layer; and a second oxygen containing layer disposed atop the second nitrogen containing layer and an upper surface of the first oxygen containing layer.

In some embodiments, a device may include a substrate having a first floating gate, a second floating gate and an isolation layer disposed between the first floating gate and the second floating gate; a first nitrogen containing layer disposed atop an upper portion and sidewalls of the first floating gate and second floating gate; a first oxygen containing layer disposed atop the first nitrogen containing layer and an upper surface of the isolation layer; a second nitrogen containing layer disposed atop an upper portion and sidewalls of the first oxygen containing layer; and a second oxygen containing layer disposed atop the second nitrogen containing layer and an upper surface of the first oxygen containing layer, wherein the first and second nitrogen containing layers and the first and second oxygen containing layers form an interlayer polysilicon dielectric cap.

In some embodiments, a method of forming an interlayer polysilicon dielectric cap atop a substrate having a first floating gate, a second floating gate and an isolation layer disposed between the first floating gate and the second floating gate, may include selectively forming a first nitrogen containing layer atop an upper portion and sidewalls of the first floating gate and second floating gate; forming a first oxygen containing layer atop the first nitrogen containing layer and an upper surface of the isolation layer; depositing a second nitrogen containing layer atop the first oxygen containing layer, wherein the second nitrogen containing layer has a first thickness deposited above the upper portion of the first floating gate and second floating gate and a second thickness deposited above the upper surface of the isolation layer, and wherein the second thickness is less than the first thickness; and forming a second oxygen containing layer by oxidizing at least a portion of the second nitrogen containing layer deposited above the upper portion of the first floating gate and second floating gate and substantially all of the second nitrogen containing layer deposited above the upper surface of the isolation layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

An interlayer polysilicon dielectric cap and method of making the same is provided herein. The inventive interlayer polysilicon dielectric (IPD) cap may advantageously comprise non-conformal nitrogen containing layers between adjacent floating gates, thereby reducing or eliminating electrical coupling of the adjacent floating gates, thus minimizing or eliminating leakage between the adjacent floating gates of a device. In addition, the inventive method advantageously utilizes multiple non-conformal layer formation processes to facilitate forming the non-conformal nitrogen containing layers. Although not limiting in scope, the present invention may be particularly advantageous for the fabrication of memory devices, such as NAND flash memory devices, specifically with respect to scaled down NAND flash memory devices (e.g., less than 45 nm devices.)

Figure 1:
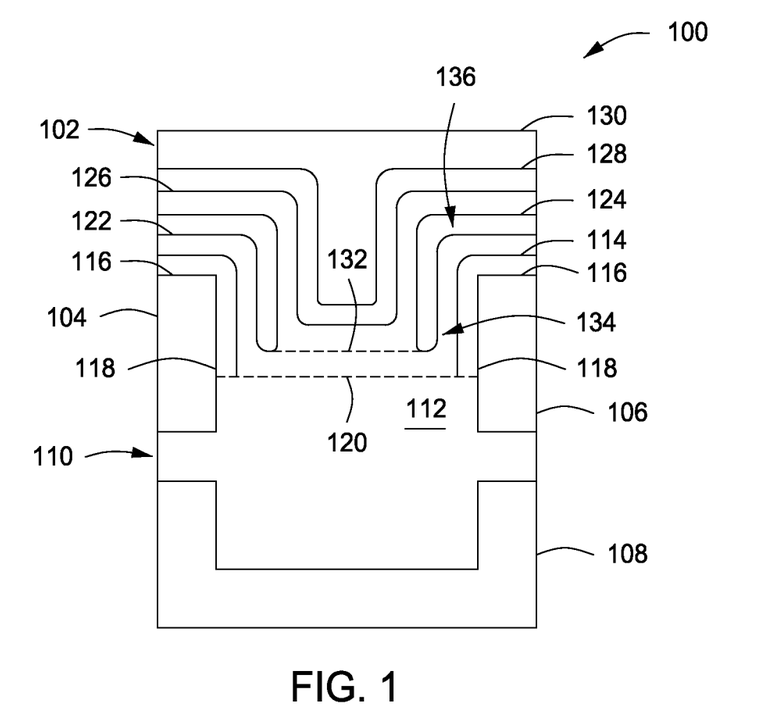
FIG. 1 depicts a cross sectional view of a device having an interlayer polysilicon dielectric (IPD) cap in accordance with some embodiments of the present invention.

FIG. 1 is a cross sectional view of a device 100 having an interlayer polysilicon dielectric (IPD) cap 102 in accordance with some embodiments of the present invention. The device 100 may be any type of device utilizing adjacent field gates that require isolation from one another. For example, in some embodiments, the device 100 may be a memory device, for example a NAND flash memory device. In some embodiments, the device 100 may be a scaled down NAND flash memory device, or other suitable device, having, for example, a 45 nm, 30 nm, or 20 nm node size.

In some embodiments, the device 100 generally comprises a substrate 108, a plurality of floating gates (a first floating gate 104 and a second floating gate 106 shown), an isolation layer 110 (sometimes referred to as a tunnel oxide layer), and the IPD cap 102.

The substrate 108 may comprise any material suitable for fabrication of the device 100 (e.g., a NAND flash memory device), for example, such as crystalline silicon (e.g., Si<100> or Si<111>), strained silicon, silicon germanium, doped or undoped polysilicon, doped or undoped silicon wafers, patterned or non-patterned wafers, silicon on insulator (SOI), carbon doped silicon oxides, doped silicon, germanium, gallium arsenide, glass, sapphire, or the like.

In some embodiments, the isolation layer 110 may be disposed between the substrate 108 and the first and second floating gates 104, 106 and may extend into an isolation region 112 (sometimes referred to as a field oxide layer) between the first and second floating gates 104, 106 to facilitate isolation of the first and second floating gates 104, 106 from one another and from the substrate 108. The isolation layer 110 may comprise any materials suitable to provide the aforementioned isolation of the first and second floating gates 104, 106 and substrate 108. For example, in some embodiments, the isolation layer 100 may comprise silicon and oxygen, such as silicon oxide ($SiO_2$), silicon oxynitride (SiON), or high-k dielectric materials, such as aluminum-(Al), hafnium-(Hf), lanthanum-(La), or zirconium-(Zr) based oxides or oxinitrides, or silicon nitrides ($Si_xN_y$), in single or layered structures (e.g., $SiO_2$/high-k/$SiO_2$), or the like. In addition, the isolation layer 110 may have any thickness suitable to provide the isolation of the first and second floating gates 104, 106 and the substrate 108 as discussed above, for example, such as about 50 to about 80 Å.

The first and second floating gates 104, 106 may comprise any material suitable to form a desired device (e.g. a memory device) for example, a conductive material such as a metal, doped or undoped silicon or polysilicon, or the like. In some embodiments, the first and second floating gates 104, 106 may comprise titanium (Ti), tantalum (Ta), titanium nitride (TiN), tantalum nitride (TaN), tungsten (W), or the like.

In some embodiments, the IPD cap 102 may comprise alternating layers of nitrogen containing layers and oxygen containing layers (e.g., a NONON structure). In such embodiments, the IPD cap 102 may comprise a first nitrogen containing layer 114 disposed atop an upper portion 116 and sidewalls 118 of the first and second floating gates 104, 106. The inventors have observed that by providing the first nitrogen containing layer 114 atop an upper portion 116 and sidewalls 118 of the first and second floating gates 104, 106 and not atop a top surface 120 of the isolation layer 110 (such as provided in conventional IPD caps) electrical coupling of the first and second floating gates 104, 106 may be prevented or reduced, thereby significantly reducing or eliminating leakage between the first and second floating gates 104, 106, thus increasing device performance.

The first nitrogen containing layer 114 may comprise any nitrogen containing materials suitable to form the desired device 100. For example, in some embodiments, the first nitrogen containing layer 114 may comprise silicon and nitrogen, for example such as a silicon nitride (SiN), silicon oxynitride (SiON), or the like. In some embodiments, the first nitrogen containing layer 114 may have a thickness of about 5 to about 20 Å. In some embodiments, the first nitrogen containing layer 114 may comprise a nitrogen content of about 10 to about 90 atomic percent.

In some embodiments, a first oxygen containing layer 122 may be disposed atop the first nitrogen containing layer 114 and the top surface 120 of the isolation layer 110. In some embodiments, the first oxygen containing layer 122 may comprise silicon and oxygen for example, such as silicon oxide ($SiO_2$), silicon oxynitride (SiON), or high-k dielectric materials, such as aluminum-(Al), hafnium-(Hf), lanthanum-(La), or zirconium-(Zr) based oxides or oxinitrides, or silicon nitrides ($Si_xN_y$), in single or layered structures (e.g., $SiO_2$/high-k/$SiO_2$), or the like. In some embodiments, the first oxygen containing layer 122 may comprise the same, or in some embodiments, a different material as the material used for the isolation layer 100. For example, in embodiments where the isolation layer 110 comprises an oxide, for example, silicon oxide ($SiO_2$), the first oxygen containing layer 122 may also comprise silicon oxide ($SiO_2$). In some embodiments, the first oxygen containing layer 122 may have a thickness of about 20 to about 40 Å. In some embodiments, the first oxygen containing layer 122 may comprise oxygen content of about 50 to about 80 atomic percent.

In some embodiments, a second nitrogen containing layer 124 may be disposed atop an upper portion 136 and sidewalls 134 of the first oxygen containing layer 122. The inventors have observed that by providing the second nitrogen containing layer 124 atop the upper portion 136 and sidewalls 134 of the first oxygen containing layer 122 and not atop a bottom surface 132 of the first oxygen containing layer 122 (such as provided in conventional IPD caps) electrical coupling of the first and second floating gates 104, 106 may be prevented or reduced, thereby significantly reducing or eliminating leakage between the first and second floating gates 104, 106, thus increasing device performance.

The second nitrogen containing layer 124 may comprise any nitrogen containing materials suitable to form the desired device 100, for example, such as the materials discussed above with respect to the first nitrogen containing layer 114. In some embodiments, the second nitrogen containing layer 124 may comprise the same, or in some embodiments, a different material as the materials utilized in the first nitrogen containing layer 114, discussed above. In some embodiments, the second nitrogen containing layer 124 may have a thickness of about 20 to about 40 Å.

In some embodiments, a second oxygen containing layer 126 may be disposed atop the second nitrogen containing layer 124 and the bottom surface 132 of the first oxygen containing layer 122. The second oxygen containing layer 126 may comprise may comprise silicon and oxygen for example, such as silicon oxide ($SiO_2$), or any of the materials discussed above with respect to the first oxygen containing layer 122. In some embodiments, the second oxygen containing layer 126 may comprise the same, or in some embodiments, a different material as the materials utilized in the first oxygen containing layer 122. In some embodiments, the second oxygen containing layer 126 may have a thickness of about 20 to about 50 Å. In some embodiments, the second oxygen containing layer 126 may comprise oxygen content of about 40 to about 80 atomic percent.

In some embodiments, an optional third nitrogen containing layer 128 may be disposed atop the second oxygen containing layer 126. The third nitrogen containing layer 128 may comprise any nitrogen containing materials suitable to form the desired device 100, for example, such as the materials discussed above with respect to the first nitrogen containing layer 114 and/or second nitrogen containing layer 124. The third nitrogen containing layer 128 may comprise the same, or in some embodiments, a different material as the materials utilized in the first nitrogen containing layer 114 and second nitrogen containing layer 124. In some embodiments, the third nitrogen containing layer 128 may have a thickness of about 10 to about 20 Å. In some embodiments, the third nitrogen containing layer 128 may comprise a nitrogen content of about 10 to about 100 atomic percent.

In some embodiments, a control gate layer 130 may be disposed atop the second oxygen containing layer 126 (or optional third nitrogen containing layer 128 when present). In some embodiments, the control gate layer 130 comprises a conductive material such as a metal, doped or undoped silicon or polysilicon, or the like.

Figure 2:
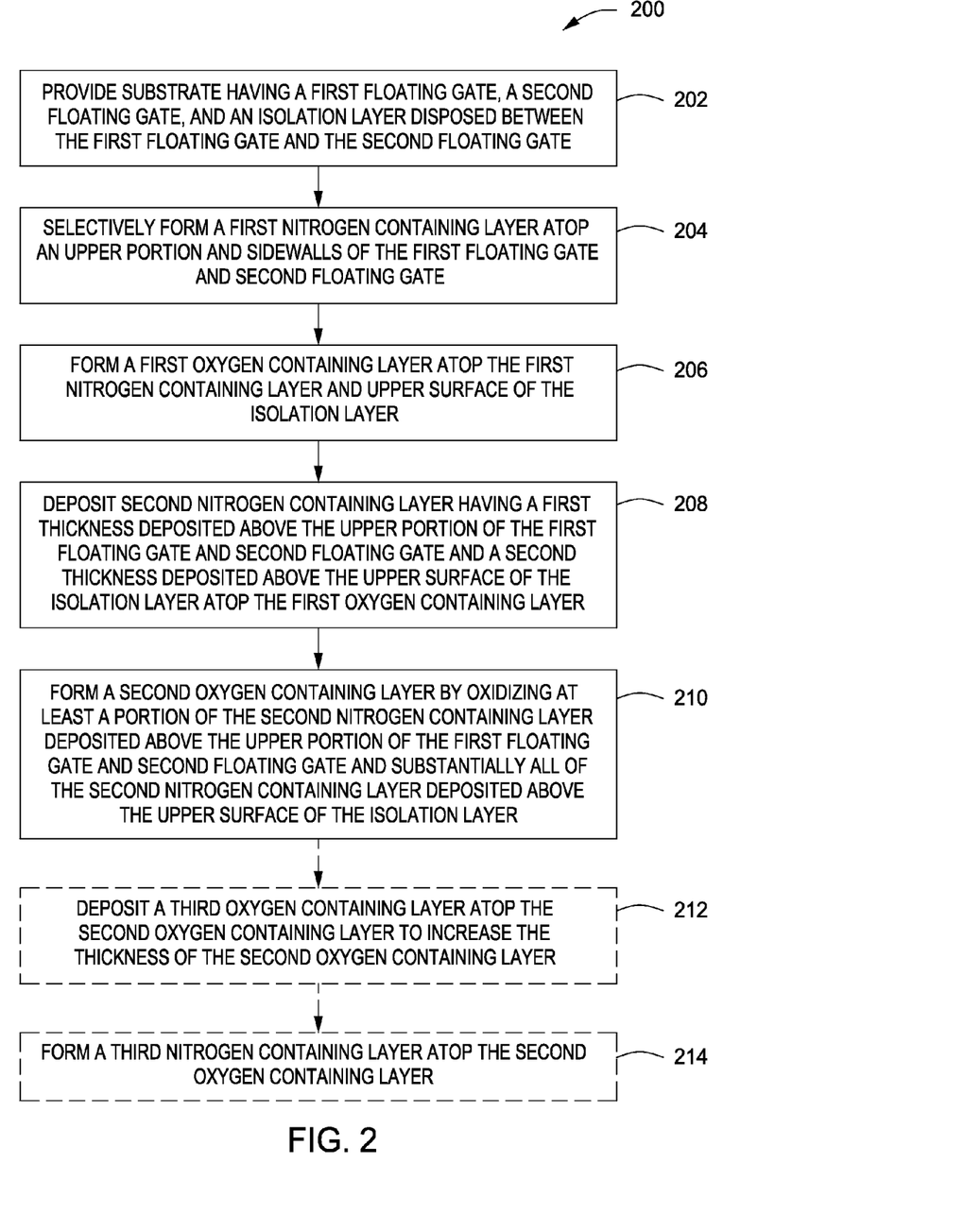
FIG. 2 depicts a method for forming an interlayer polysilicon dielectric cap in accordance with some embodiments of the present invention.

FIG. 2 depicts a method 200 for forming an interlayer polysilicon dielectric (IPD) cap, for example such as the IPD cap 102 described above in FIG. 1, in accordance with some embodiments of the present invention.

Figure 3A:
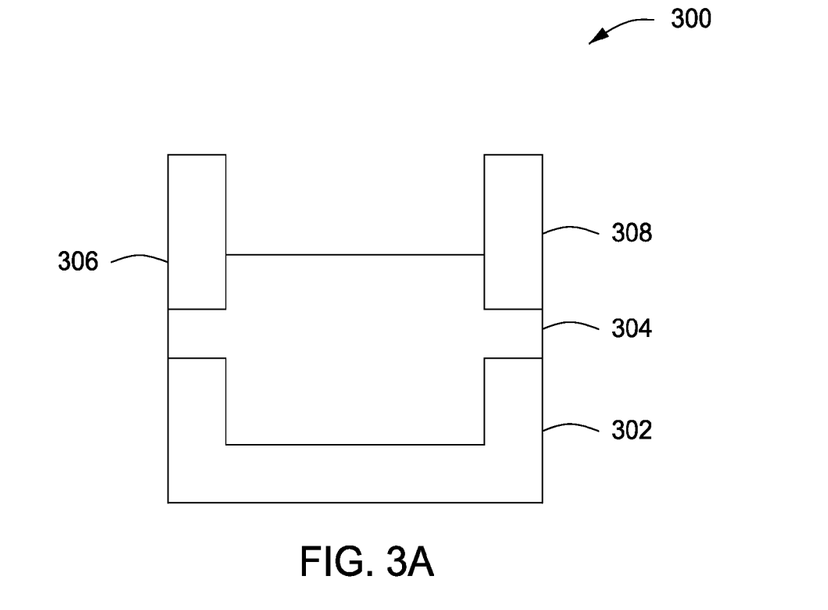
FIGS. 3A-H depicts cross sectional views of the interlayer polysilicon dielectric cap throughout various stages of the method for forming an interlayer polysilicon dielectric cap in accordance with some embodiments of the present invention.

The method begins at 202 by providing a substrate 302 having a first floating gate 306, second floating gate 308 and an isolation layer 304, as shown in FIG. 3A. In some embodiments, the isolation layer 304 may be disposed between the substrate 302 and the first floating gate 306 and second floating gate 308 and may extend between the first floating gate 306 and second floating gate 308 to facilitate isolation of the first and second floating gates 306, 308 from one another and from the substrate 302.

The substrate 302 may comprise any type of material suitable for fabrication of the device 300 (e.g., a NAND flash memory device), for example, such as the substrates discussed above with respect to FIG. 1. The isolation layer 304 may comprise any materials suitable to provide the aforementioned isolation of the first and second floating gates 306, 308 and substrate 302, for example, such as the materials described above with respect to the isolation layer 110 as shown in FIG. 1. The first and second floating gates 306, 308 may comprise any material suitable to form a desired device (e.g. a memory device) for example, such as the materials described above with respect to the first and second floating gates 104, 106 as shown in FIG. 1.

Figure 3B:
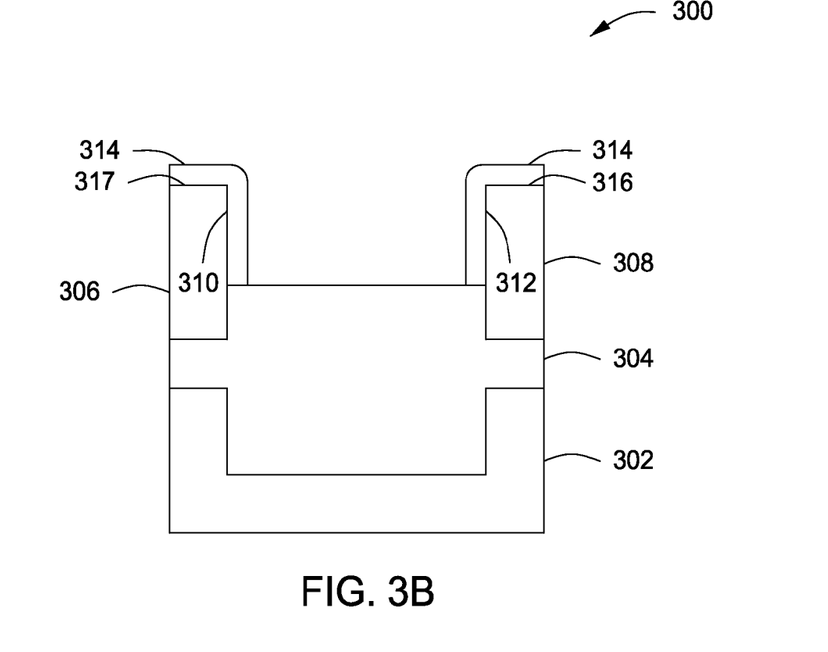

Next, at 204 a first nitrogen containing layer 314 is selectively formed atop an upper portion 316, 317 and sidewalls 310, 312 of the first and second floating gates 306, 308, as shown in FIG. 3B. The first nitrogen containing layer 314 may comprise any nitrogen containing material suitable to form the desired device, for example, such as any of the materials discussed above with respect to the first nitrogen containing layer 114 described above in FIG. 1. In some embodiments, the first nitrogen containing layer 314 may be deposited to a thickness of about 10 to about 20 Å.

The first nitrogen containing layer 314 may be formed using any nitridation process suitable to deposit the specific materials of the first nitrogen containing layer 314 for a desired device 300, for example, such as plasma nitridation process using a decoupled plasma source. Exemplary chambers suitable to form the nitrogen containing layer 314 may be any chamber configured for plasma nitridation, such as the SINGEN®, RADOX™, RADIANCE®, or VANTAGE® process chamber, or any chamber capable of decoupled plasma nitridation (DPN) or remote plasma nitridation (RPN) available commercially from Applied Materials, Inc. of Santa Clara, Calif. Other chambers suitable to perform the nitrogen containing layer 314 may also be used.

In some embodiments, for example where the first nitrogen containing layer 314 is formed via a plasma nitridation process, the first nitrogen containing layer 314 may be formed by exposing the upper portion 316, 317 and sidewalls 310, 312 of the first and second floating gates 306, 308 to a plasma formed from a nitrogen containing process gas.

The inventors have observed that because of the preferential reaction of nitrogen containing radicals with silicon due to lower Si—Si bond energies (as compared to Si—O bonds) utilizing nitrogen radicals may provide a higher selectivity as opposed to utilizing nitrogen ions. Accordingly, in some embodiments, the upper portion 316, 317 and sidewalls 310, 312 of the first and second floating gates 306, 308 may be exposed to nitrogen radicals formed in the plasma. In such embodiments a ratio of a concentration of nitrogen in silicon to a concentration of nitrogen in oxide after a given process may be about 10:1 to about 100:1, or in some embodiments about 20:1 to about 70:1, or in some embodiments, about 40:1.

In some embodiments, an in situ plasma generation process may be used. Alternatively, in some embodiments, the plasma may be remotely generated. In such embodiments, the remote plasma generator, for example a microwave, RF, or thermal chamber, may be connected to a processing chamber by a relatively long pathway to encourage ionic species to recombine along the pathway before reaching the process chamber, thereby forming nitrogen radicals. The radicals may then flow into the process chamber, for example, through a showerhead or radical distributor in some embodiments, or through a portal entry in a side wall of the chamber.

In some embodiments, the nitrogen containing gas may comprise nitrogen ($N_2$), ammonia ($NH_3$), hydrazine ($N_2H_4$), lower substituted hydrazines ($N_2R_2$, wherein each R is independently hydrogen, a methyl, ethyl, propyl, vinyl, or propenyl group), and lower amines ($NR_aH_b$, wherein a and b are each integers from 0 to 3 and a+b=3, and each R is independently hydrogen, a methyl, ethyl, propyl, vinyl, or propenyl group), amides (RCONR'R", wherein R, R', and R" are each independently hydrogen, a methyl, ethyl, propyl, vinyl, or propenyl group), imines (RR'C=NR", wherein R, R', and R" are each independently hydrogen, a methyl, ethyl, propyl, vinyl, or propenyl group), or imides (RCONR'COR", wherein R, R', and R" are each independently hydrogen, a methyl, ethyl, propyl, vinyl, or propenyl group).

In some embodiments, the process gas may further include an inert gas, such as argon (Ar), helium (He), krypton (Kr), xenon (Xe), or the like. In such embodiments, the process gas may comprise about 50 to about 95 percent of the nitrogen containing gas. The process gas may be supplied at any total gas flow suitable to provide a sufficient amount of nitrogen containing gas to form the plasma for the nitridation process. For example, in some embodiments, the process gas may be supplied at a total flow rate of about 1000 to about 20000 sccm.

The plasma may be formed from the process gas using, for example, an inductively coupled plasma source. In some embodiments, the plasma source may be RF source power. In some embodiments, the RF source power provided is between about 0.5 to about 5 kW at frequency of about 2 MHz to about 2 GHz.

In addition, other parameters may be utilized to facilitate the nitridation process. For example, in some embodiments, the nitridation process is performed while maintaining the substrate 302 at a temperature of about 300° C. and about 1200° C., or in some embodiments about 800° C. and about 1000° C. In some embodiments, the temperature may be gradually increased during the process to volatilize surface deposited nitrogen, thereby offsetting surface saturation and, thus, increasing penetration of nitrogen into the substrate.

In some embodiments, to form a high radical density versus ion density of nitrogen containing radicals (e.g., N, NH, or NH$_2$) in the plasma a pressure of greater than about 5 Torr may be maintained in the process chamber. The inventors have observed that providing such a pressure encourages ions to recombine with electrons quickly, leaving neutral radical species and inactive species.

Figure 3C:
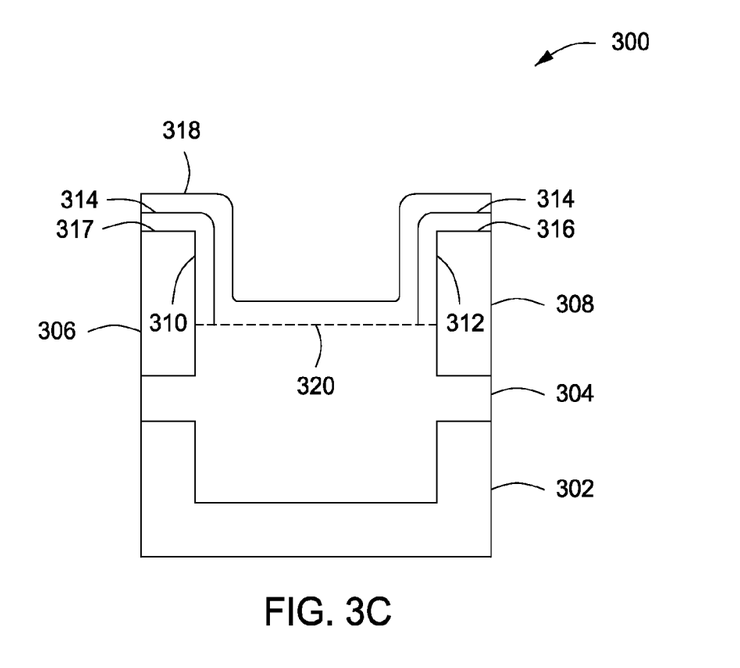

Next, at 206, a first oxygen containing layer 318 is formed atop the first nitrogen containing layer 314 and an upper surface 320 of the isolation layer 304, as shown in FIG. 3C. The first oxygen containing layer 318 may comprise silicon and oxygen for example, such as silicon oxide (SiO$_2$), or the like. In some embodiments, the first oxygen containing layer 318 may be formed to a thickness of about 20 to about 40 Å.

In some embodiments, the first oxygen containing layer 318 may be formed by an oxidation process, a deposition process, or a combination thereof. For example, suitable processes may include thermal oxidation, chemical vapor deposition (CVD), low pressure chemical vapor deposition (LPCVD), atomic layer deposition (ALD), plasma enhanced chemical vapor deposition (PECVD), or combinations thereof. In embodiments where the first oxygen containing layer 318 is formed via an oxidation process, the process may be performed at a high temperature (e.g. about 800 to about 1200 degrees Celsius) to create a high temperature oxide layer (HTO). Any type of process chamber capable of performing any of the aforementioned processes may be utilized. Exemplary process chambers include the RADOX™, RADIANCE®, VANTAGE®, or SINGEN® chambers available commercially from Applied Materials, Inc. of Santa Clara, Calif.

In an exemplary deposition process, for example a chemical vapor deposition (CVD), the first oxygen containing layer 318 may be deposited from a chemical vapor resulting from a desired chemical reaction of one or more precursor gases comprising a deposition gas mixture. For example, the deposition gas mixture may include one or more precursor gases, and may optionally further include an inert or carrier gas.

For example, in embodiments where the first oxygen containing layer 318 comprises silicon oxide (SiO$_2$), the deposition gas mixture may comprises a silicon-containing gas, an oxygen-containing gas, and the carrier gas. Exemplary silicon-containing gas may include, but are not limited to, one or more of silanes, halogenated silanes, and organosilanes. Exemplary oxygen-containing gases may include, but are not limited to, one or more of oxygen (O$_2$), ozone (O$_3$), or water vapor (H$_2$O). The carrier gas may include nitrogen (N$_2$), hydrogen (H$_2$), argon, helium and combinations thereof. A carrier gas may be selected based the identity of the one or more precursor gases and/or the process temperature during the deposition process. The deposition gas mixture and/or the process chamber may be maintained at a processing temperatures and pressures suitable for depositing the first oxygen containing layer 318.

Figure 3D:
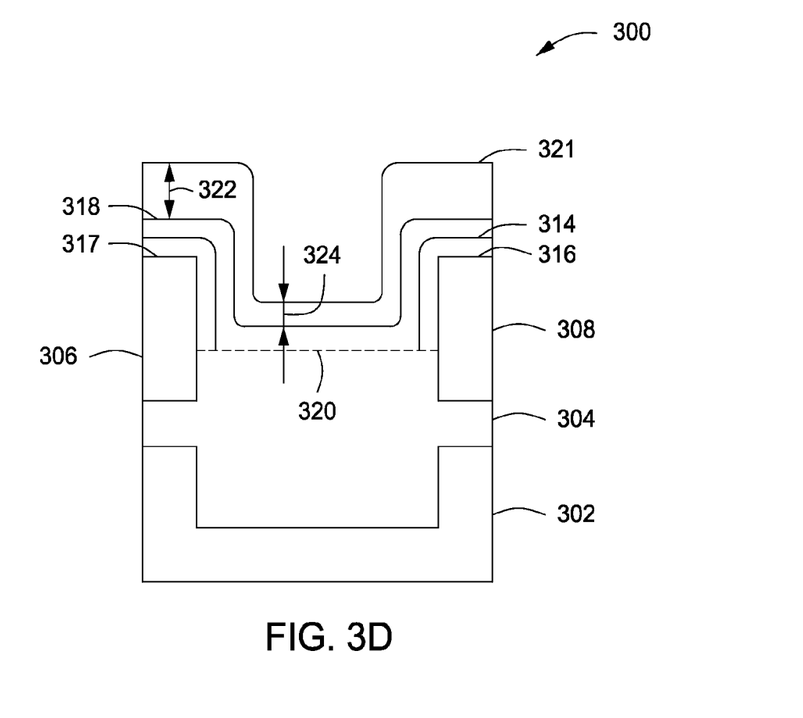

Next, at 208, a second nitrogen containing layer 321 is deposited atop the first oxygen containing layer 318, the second nitrogen containing layer 321 having a first thickness 322 deposited above the upper portion 316, 317 of the first and second floating gate 306 and a second thickness 324 deposited above the upper surface 320 of the isolation layer 304, as shown in FIG. 3D. The second nitrogen containing layer 321 may comprise any nitrogen containing material suitable to form the desired device, for example, such as the materials described above with respect to the second nitrogen layer 124 shown in FIG. 1.

The second nitrogen containing layer 321 may be deposited via any suitable process capable of depositing the second nitrogen containing layer 321 to the desired thicknesses, for example such as the process described above with respect to the formation of the first nitrogen containing layer 314. Any type of process chamber capable of performing any of the aforementioned processes may be utilized. An exemplary process chamber includes the SINGEN® chamber available commercially from Applied Materials, Inc. of Santa Clara, Calif.

Providing the second nitrogen containing layer 321 as a non-conformal layer (i.e., having the first thickness 322 and second thickness 324 as described above) allows for a portion of the second nitrogen containing layer 321 above the upper portion 316, 317 of the first and second floating gate 306 to be partially consumed and substantially all of the second nitrogen containing layer 321 deposited above the upper surface 320 of the isolation layer 304 to be substantially all consumed in a subsequent oxidation step (as described below). In some embodiments, the first thickness 322 is about 30 to about 50 Å. In some embodiments, the second thickness 324 is about 10 to about 30 Å.

Figure 3E:
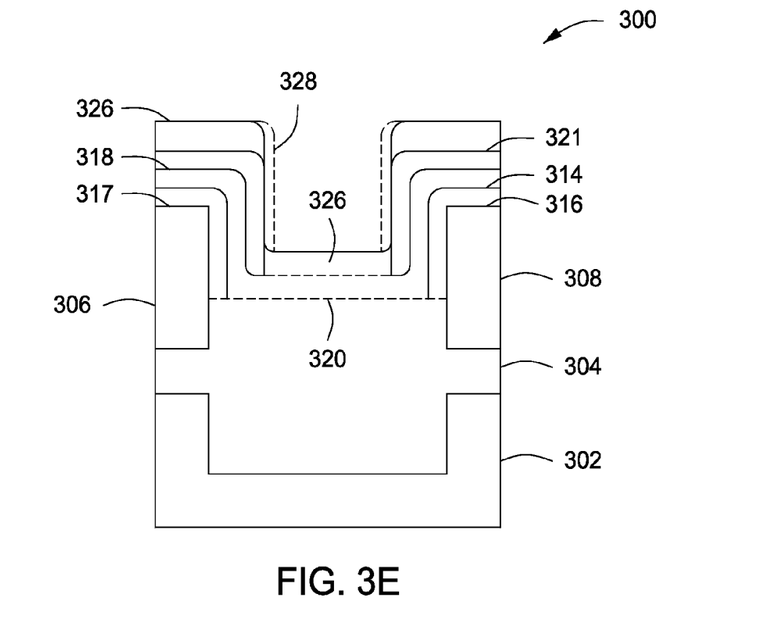

Next, at 210, a second oxygen containing layer 326 is formed by oxidizing at least a portion of the second nitrogen containing layer 321 deposited above the upper portion 316, 317 of the first and second floating gate 306 and substantially all of the second nitrogen containing layer 321 deposited above the upper surface 320 of the isolation layer 304, as shown in FIG. 3E. The inventors have observed that by forming a non-conformal second oxygen containing layer 326 (i.e., by performing the aforementioned oxidation process) and removing substantially all of the second nitrogen containing layer 321 deposited above the upper surface 320 of the isolation layer 304, electrical coupling of the first and second floating gates 306, 308 may be prevented or reduced, significantly reducing or eliminating leakage between the first and second floating gates 306, 308, thus increasing device 300 performance.

The second oxygen containing layer 326 may comprise any oxygen containing materials suitable to form the desired device, for example, such as the materials discussed above with respect to the second oxygen containing layer 126 shown in FIG. 1. In some embodiments, the second oxygen containing layer 326 may be about 40 to about 80 Å thick.

Any suitable oxidation process may be utilized to form the second oxygen containing layer 326, for example a plasma oxidation such as decoupled plasma oxidation (DPO). Exemplary process chambers suitable for performing the oxidation process may include any process chamber configured to perform a decoupled plasma oxidation (DPO) process available from Applied Materials, Inc. of Santa Clara, Calif. Other suitable process chambers may also be used, including those available from other manufacturers.

In an exemplary oxidizing process, the second nitrogen containing layer 321 may be exposed to an oxidizing plasma formed from an oxidizing process gas. In some embodiments, the oxidizing process gas comprises an oxygen-containing gas, for example, such as oxygen (O$_2$), ozone (O$_3$), water vapor (H$_2$O), or the like. In some embodiments, the oxidizing process gas may further include an inert gas, such as argon (Ar), helium (He), krypton (Kr), xenon (Xe), or the like to act as a carrier gas and/or to further facilitate oxidation. In such embodiments, the oxidizing process gas may comprise about 10 to about 99 percent of the oxygen containing gas. The oxidizing process gas may be supplied at any total gas flow suitable to provide a sufficient amount of oxygen containing gas to form the plasma for the oxidation process. For example, in some embodiments, the oxidizing process gas may be supplied at a total flow rate of about 1000 to about 50000 sccm.

To form the oxidizing plasma, a plasma power, for example, an RF power is coupled to the oxidizing process gas. In some embodiments, the RF power may be about 50 to about 5000 W at a frequency of about 2 MHz to about 2 GHz to form the plasma. Other parameters may be utilized to maintain the oxidizing plasma and/or facilitate oxidation. For example, in some embodiments, the process chamber may be maintained at a pressure of about 1 to about 500 Torr. Alternatively or in combination, in some embodiments, the substrate 320 may be maintained at a temperature of about 500 to about 1000 degrees Celsius.

The charged species contained within the oxidizing plasma may provide some directionality of the charged species towards the substrate thus causing them to accelerate towards the substrate due to a self bias of the substrate 302 in the presence of the oxidizing plasma, therefore facilitating the removal of portions of the second nitrogen containing layer 321 as described above. In addition, by providing a biasing power to the substrate 302, the flux of the oxidizing plasma may be controlled, thereby providing an increased directionality and acceleration of the charged species in a direction perpendicular to the substrate 302 to facilitate removal of the second nitrogen containing layer 321 above the upper portion 316, 317 of the first and second floating gate 306 and the upper surface 320 of the isolation layer 304. Accordingly, in some embodiments, a bias power of about 50 to about 1000 Watts may be provided to the substrate 302 during processing.

Figure 3F:
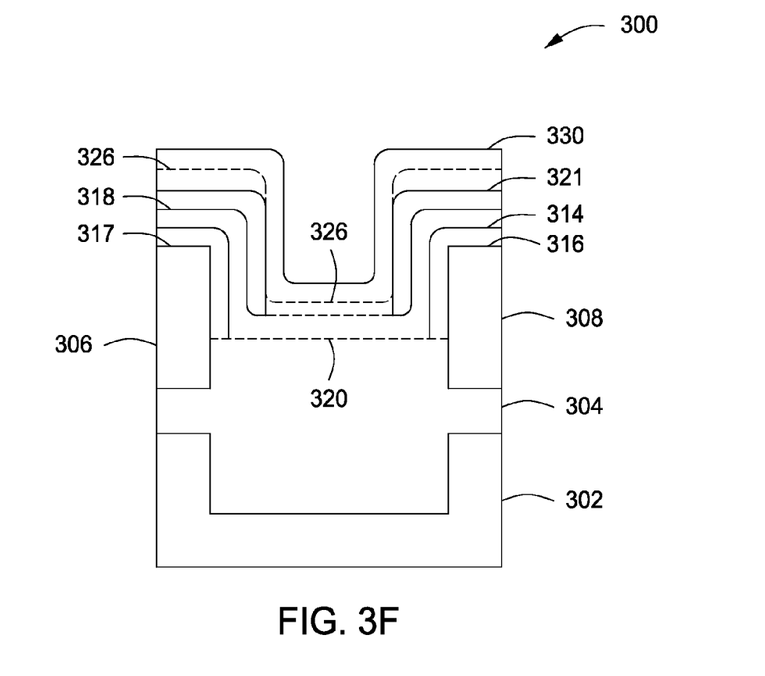

The inventors have observed that during the formation of the second oxygen containing layer 326 at 210, some oxidation may occur on sidewalls of the second nitrogen containing layer 321 (shown in phantom at 328). However, this oxidation on the second nitrogen containing layer 321 on the sidewalls may not provide a sufficient thickness of oxide layer to provide the capacitive coupling of the floating gates 306, 308 required for acceptable device 300 performance. For example, in some embodiments, the thickness of the second oxygen containing layer 326 on the sidewalls after the oxidation process may be up to about 20 Å. Accordingly, next, at 212, in some embodiments a third oxygen containing layer 330 may optionally be deposited atop the second oxygen containing layer 326 to increase the thickness of the second oxygen containing layer 326, as shown in FIG. 3F. In some embodiments, by depositing the third oxygen containing layer 330, the thickness of the second oxygen containing layer 326 may be increased to about 30 to about 60 Å.

The third oxygen containing layer 330 may comprise the same materials at the second oxygen containing layer 326 described above. The third oxygen containing layer 330 may be deposited in any manner suitable to increase the thickness of the second oxygen containing layer 326 to the desired thickness, for example, such as a process similar to the processes discussed above with respect to the formation of the first oxygen containing layer 318 as described above.

Figure 3G:
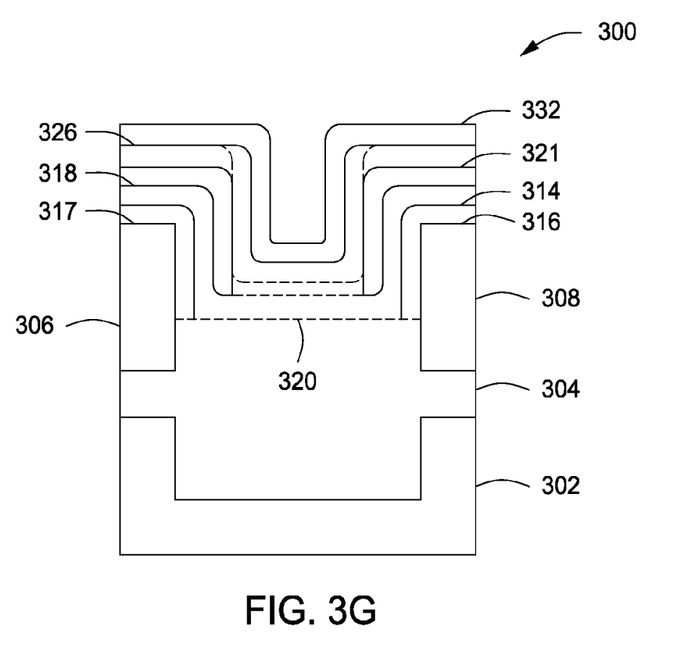

Next, at 214, in some embodiments, a third nitrogen containing layer 332 may optionally be formed atop the second oxygen containing layer 326, as shown in FIG. 3G. The third nitrogen containing layer 332 may comprise any materials suitable to form a desired device, for example such as the material discussed above with respect to the first nitrogen containing layer 314 and/or second nitrogen containing layer 321 described above. In some embodiments, the third nitrogen containing layer 332 may comprise the same, or in some embodiments, different materials as the first nitrogen containing layer 314 and second nitrogen containing layer 321.

The third nitrogen containing layer 332 may be formed via any suitable process capable of forming the third nitrogen containing layer 332 to a desired thickness, for example, such as a process similar to the processes used to form the first nitrogen containing layer 314 at 204. In some embodiments, the third nitrogen containing layer 332 may be deposited to a thickness of about 10 to about 20 Å.

Figure 3H:
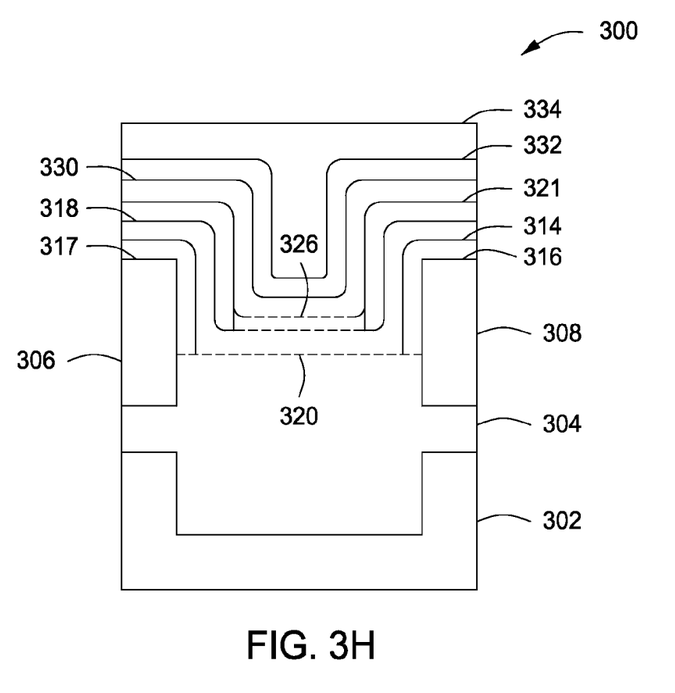

After the deposition of the third oxygen containing layer 330 (or the formation of the third nitrogen containing layer 332, when present), the method 200 generally ends and the device may proceed for further processing. For example, in some embodiments, a control gate layer may be deposited atop the third oxygen containing layer 330 (or third nitrogen containing layer 332, when present) such as shown in FIG. 3H. In some embodiments, the control gate layer 334 may comprise a conductive material, such as polysilicon, metal, or the like.

Figure 4:
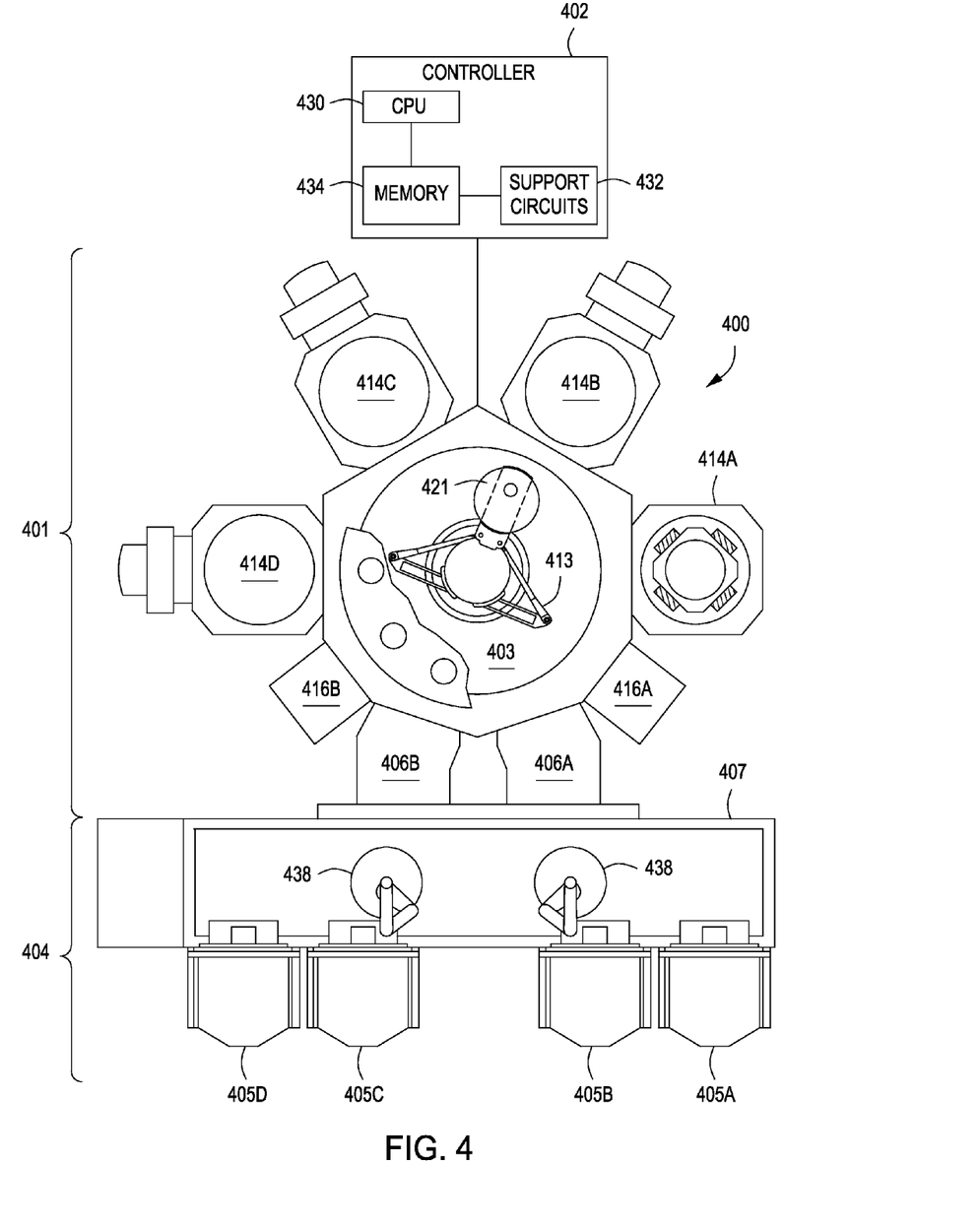
FIG. 4 is a cluster tool suitable to perform the method for forming an interlayer polysilicon dielectric cap in accordance with some embodiments of the present invention.

The methods described herein, for example, such as nitridation and oxidation processes may be performed in individual nitridation and oxidation chambers, such as the exemplary chambers discussed above, that may be provided in a standalone configuration or as part of a cluster tool, for example, an integrated tool 400 (i.e., cluster tool) described below with respect to FIG. 4. Examples of the integrated tool 400 include the CENTURA® and ENDURA® integrated tools, for example the CENTURA® DPN Gate Stack, all available from Applied Materials, Inc., of Santa Clara, Calif. It is contemplated that the methods described herein may be practiced using other cluster tools having suitable process chambers coupled thereto, or in other suitable process chambers.

The integrated tool 400 includes a vacuum-tight processing platform 401, a factory interface 404, and a system controller 402. The platform 401 comprises multiple processing chambers, such as 414A, 414B, 414C, and 414D operatively coupled to a vacuum substrate transfer chamber 403. The factory interface 404 is operatively coupled to the transfer chamber 403 by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the loadlock chambers, such as 406A and 406B. Each of the loadlock chambers 406A and 406B have a first port coupled to the factory interface 404 and a second port coupled to the transfer chamber 403. The load lock chamber 406A and 406B are coupled to a pressure control system (not shown) which pumps down and vents the chambers 406A and 406B to facilitate passing the substrates between the vacuum environment of the transfer chamber 403 and the substantially ambient (e.g., atmospheric) environment of the factory interface 404. The transfer chamber 403 has a vacuum robot 413 disposed therein. The vacuum robot 413 is capable of transferring substrates 421 between the load lock chamber 406A and 406B and the processing chambers 414A, 414B, 414C, and 414D.

In some embodiments, the processing chambers 414A, 314B, 314C, and 414D, are coupled to the transfer chamber 403. The processing chambers 414A, 414B, 414C, and 414D comprise at least one of an oxidation chamber, a nitridation chamber, and optionally, an etch chamber, and a deposition chamber for depositing a tunnel oxide layer, a material layer, an IPD layer, a control gate layer, or the like. Oxidation chambers may include those configured for plasma oxidation, rapid thermal oxidation, or radical oxidation. A nitridation chamber may include those configured for decoupled plasma nitridation (DPN) and the like. Etch chambers may include those configured for wet or dry etch, reactive ion etch (RIE), or the like. Examples of chambers suitable for performing at least some of the embodiments of the invention have been discussed above.

In some embodiments, one or more optional service chambers (shown as 416A and 416B) may be coupled to the transfer chamber 403. The service chambers 416A and 416B may be configured to perform other substrate processes, such as degassing, orientation, substrate metrology, cool down and the like.

The system controller 402 controls the operation of the tool 400 using a direct control of the process chambers 414A, 414B, 414C, and 414D or alternatively, by controlling the computers (or controllers) associated with the process chambers 414A, 414B, 414C, and 414D and the tool 400. In operation, the system controller 402 enables data collection and feedback from the respective chambers and systems to optimize performance of the tool 400. The system controller 402 generally includes a Central Processing Unit (CPU) 430, a memory 434, and a support circuit 432. The CPU 430 may be one of any form of a general purpose computer processor that can be used in an industrial setting. The support circuit 432 is conventionally coupled to the CPU 430 and may comprise a cache, clock circuits, input/output subsystems, power supplies, and the like. Software routines, such as a method as described above, when executed by the CPU 430, transform the CPU 430 into a specific purpose computer (controller) 402. The software routines may also be stored and/or executed by a second controller (not shown) that is located remotely from the tool 400.

Thus, an interlayer polysilicon dielectric cap and method of making the same is provided herein. The inventive interlayer polysilicon dielectric (IPD) cap may advantageously comprise non-conformal nitrogen containing layers between adjacent floating gates, thereby reducing or eliminating electrical coupling of the adjacent floating gates, thus minimizing or eliminating leakage between the adjacent floating gates of a device. In addition, the inventive method advantageously utilizes multiple non-conformal layer formation processes to facilitate forming the non-conformal nitrogen containing layers. Although not limiting in scope, the present invention may be particularly advantageous for the fabrication of memory devices, such as NAND flash memory devices, specifically with respect to scaled down NAND flash memory devices (e.g., less than 45 nm devices.)

While the foregoing is directed to embodiments of the present invention, other and further embodiments of the invention may be devised without departing from the basic scope thereof.

The invention claimed is:

1. An interlayer polysilicon dielectric cap disposed atop a substrate having a first floating gate, a second floating gate and an isolation layer disposed between the first floating gate and the second floating gate, comprising:
   a first nitrogen containing layer disposed atop an upper portion and sidewalls of the first floating gate and second floating gate;
   a first oxygen containing layer disposed atop the first nitrogen containing layer and an upper surface of the isolation layer;
   a second nitrogen containing layer disposed atop an upper portion and sidewalls of the first oxygen containing layer; and
   a second oxygen containing layer disposed atop and in direct contact with the second nitrogen containing layer and an upper surface of the first oxygen containing layer.

2. The interlayer polysilicon dielectric cap of claim 1, further comprising a third nitrogen containing layer disposed atop the second oxygen containing layer.

3. The interlayer polysilicon dielectric cap of claim 2, wherein the third nitrogen containing layer is about 10 to about 20 Å thick.

4. The interlayer polysilicon dielectric cap of claim 2, further comprising a control gate layer disposed atop the third nitrogen containing layer.

5. The interlayer polysilicon dielectric cap of claim 1, wherein the first nitrogen containing layer is about 5 to about 20 Å thick.

6. The interlayer polysilicon dielectric cap of claim 1, wherein the first oxygen containing layer is about 20 to about 40 Å thick.

7. The interlayer polysilicon dielectric cap of claim 1, wherein the second nitrogen containing layer is about 20 to about 40 Å thick.

8. The interlayer polysilicon dielectric cap of claim 1, wherein the second oxygen containing layer is about 40 to about 80 Å thick.

9. The interlayer polysilicon dielectric cap of claim 1, wherein the first nitrogen containing layer and the second nitrogen containing layer comprise at least one of silicon nitride (SiN), silicon oxynitride (SiON).

10. The interlayer polysilicon dielectric cap of claim 1, wherein the first oxygen containing layer and the second oxygen containing layer each comprise at least one of silicon oxide ($SiO_2$) or a high-k material.

11. A device, comprising:
   a substrate having a first floating gate, a second floating gate and an isolation layer disposed between the first floating gate and the second floating gate;
   a first nitrogen containing layer disposed atop an upper portion and sidewalls of the first floating gate and second floating gate;
   a first oxygen containing layer disposed atop the first nitrogen containing layer and an upper surface of the isolation layer;
   a second nitrogen containing layer disposed atop an upper portion and sidewalls of the first oxygen containing layer; and
   a second oxygen containing layer disposed atop and in direct contact with the second nitrogen containing layer and an upper surface of the first oxygen containing layer, wherein the first and second nitrogen containing layers and the first and second oxygen containing layers form an interlayer polysilicon dielectric cap.

12. The device of claim 11, further comprising:
   a third nitrogen containing layer disposed atop the second oxygen containing layer.

13. The device of claim 12, further comprising:
   a control gate layer disposed atop the third nitrogen containing layer.

14. An interlayer polysilicon dielectric cap disposed atop a substrate having a first floating gate, a second floating gate and an isolation layer disposed between the first floating gate and the second floating gate, comprising:
   a first nitrogen containing layer disposed atop an upper portion and sidewalls of the first floating gate and second floating gate;

a first oxygen containing layer disposed atop the first nitrogen containing layer and an upper surface of the isolation layer;

a second nitrogen containing layer disposed atop an upper portion and sidewalls of the first oxygen containing layer but not atop a bottom surface of the first oxygen containing layer; and a second oxygen containing layer disposed atop and in contact with the second nitrogen containing layer and an upper surface of the first oxygen containing layer.

15. A device, comprising:

a substrate having a first floating gate, a second floating gate and an isolation layer disposed between the first floating gate and the second floating gate;

a first nitrogen containing layer disposed atop an upper portion and sidewalls of the first floating gate and second floating gate;

a first oxygen containing layer disposed atop the first nitrogen containing layer and an upper surface of the isolation layer;

a second nitrogen containing layer disposed atop an upper portion and sidewalls of the first oxygen containing layer but not atop a bottom surface of the first oxygen containing layer; and a second oxygen containing layer disposed atop and in contact with the second nitrogen containing layer and an upper surface of the first oxygen containing layer, wherein the first and second nitrogen containing layers and the first and second oxygen containing layers form an interlayer polysilicon dielectric cap.

\* \* \* \* \*